(12) United States Patent
Mitzi et al.

(10) Patent No.: US 7,494,841 B2
(45) Date of Patent: Feb. 24, 2009

(54) SOLUTION-BASED DEPOSITION PROCESS FOR METAL CHALCOGENIDES

(75) Inventors: David B. Mitzi, Mahopac, NY (US); Simone Raoux, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 452 days.

(21) Appl. No.: 11/432,484

(22) Filed: May 12, 2006

(65) Prior Publication Data

US 2007/0264504 A1 Nov. 15, 2007

(51) Int. Cl.
*H01L 21/00* (2006.01)
(52) U.S. Cl. .................. 438/95; 438/102; 438/104; 438/502; 257/42; 257/E21.068; 257/E21.633
(58) Field of Classification Search ............... 438/102, 438/104, 500, 502, FOR. 394, 95; 257/42, 257/E21.071, 68, 77, 618, 633
See application file for complete search history.

(56) References Cited

U.S. PATENT DOCUMENTS

| 6,379,585 | B1* | 4/2002 | Vecht et al. ............ 252/301.35 |
| 6,875,661 | B2* | 4/2005 | Mitzi ....................... 438/285 |
| 2006/0014365 | A1* | 1/2006 | Kugler et al. ............... 438/502 |

OTHER PUBLICATIONS

K. Chrissafis, Crystal/Glass Phase Change in KSB5S8 Studied through Thermal Analysis Techniques, Chem. Mater., vol. 16, No. 10, 2004, pp. 1932-1937.*

* cited by examiner

*Primary Examiner*—Matthew Smith
*Assistant Examiner*—Julio J. Maldonado
(74) *Attorney, Agent, or Firm*—Connolly Bove Lodge & Hutz LLP; Ido Tuchman, Esq.

(57) ABSTRACT

A solution of a hydrazine-based precursor of a metal chalcogenide is prepared by adding an elemental metal and an elemental chalcogen to a hydrazine compound. The precursor solution can be used to form a film. The precursor solutions can be used in preparing field-effect transistors, photovoltaic devices and phase-change memory devices.

20 Claims, 13 Drawing Sheets

US 7,494,841 B2

SOLUTION-BASED DEPOSITION PROCESS FOR METAL CHALCOGENIDES

TECHNICAL FIELD

The present disclosure relates to preparing solutions of metal chalcogenide precursors and especially to preparing solutions in a hydrazine compound. The present disclosure is specifically concerned with preparing the solutions of the metal chalcogenide precursors without the need to first prepare a metal chalcogenide.

The present disclosure also relates to methods of depositing a film of the metal chalcogenide. The present disclosure also relates to field-effect transistors, photovoltaic devices and phase-change memory devices containing the metal chalcogenide films, as well as to methods of preparing the field-effect transistors, photovoltaic devices and phase-change memory devices.

BACKGROUND ART

Recently, certain processes have been described for depositing thin films of metal chalcogenides. For example, see U.S. Pat. No. 6,875,661 to Mitzi, entitled "Solution Deposition of Chalcogenide Films"; US Patent Publication 2005-0009225 to Mitzi et al., filed Mar. 16, 2004 entitled "Hydrazine-Free Solution Deposition of Chalcogenide Films," and US Patent Application Publication 2005-0158909 to Mitzi et al and entitled "Solution Depositon of Chalcogenide Films Containing Transition Metals," the entire disclosures of which are incorporated herein by reference.

The thin films of the metal chalcogenides are deposited using solutions prepared by dissolving a metal chalcogenide material in a hydrazine or hydrazine-like solvent. The metal chalcogenide may be of the form MX, $MX_2$, $M_2X_3$ or $M_2X$ where M=metal (e.g., Sn, Ge, Pb, In, Sb, Hg, Ga, Tl, K) or a combination thereof and X=chalcogen (e.g., S, Se, Te) or a combination thereof. Since the metals often have the potential for multiple oxidation states, the metal chalcogenide may often be non-stoichiometric and may therefore more generally be represented as $M_yX_z$ (where 0<y, z and may be an integer or non-integer).

The above-described processes for shorthand purposes can be referred to as hydrazine-precursor techniques or processes. The hydrazine-precursor technique has the advantage of being a high-throughput process, which does not require high temperatures or high vacuum conditions for the thin-film deposition process. The hydrazine precursor process thereby has the potential for being low-cost and suitable for deposition on a wide range of substrates, including those that are flexible. As metal chalcogenides can exhibit a wide range of electronic character, it may be used to prepare high-quality semiconducting, insulating or metallic films. The process has been used to deposit, for example, both n- and p-type semiconducting films for use as channel layers in thin-film transistors (TFTs), exhibiting field-effect mobilities>10 cm²N-s—approximately an order of magnitude better than previous results for spin-coatable semiconductors ["High Mobility Ultrathin Semiconducting Films Prepared by Spin Coating, Nature, vol. 428, 299 (2004)].

Besides TFTs, other electronic devices that rely on metal chalcogenide films can also be prepared using the described technique. Solar cells, for example, may consist of thin n-type chalcogenide semiconductor layers (~0.25 μm) deposited on a p-type substrate, with electrical contacts attached to each layer to collect the photocurrent. Light-emitting diodes (LEDs) are typically comprised of a p-n bilayer, which under proper forward bias conditions emits light.

Rewriteable phase-change memory generally employs a film of a chalcogenide-based phase-change material, which must be switchable between two physical states (e.g., amorphous-crystalline, crystalline phase 1-crystalline phase II). The state of the phase change material must also be detectable using some physical measurement (e.g., optical absorption, optical reflectivity, electrical resistivity, index of refraction). As an example, commercially-available rewritable optical memory generally relies on a film of a metal chalcogenide material such as $Ge_2Sb_2Te_5$ or $KSb_5S_8$ ["$KSb_5S_8$: A Wide Bandgap Phase-Change Material for Ultra High Density Rewritable Information Storage," Adv. Mater., vol. 15, 1428, 2003]. Initially the film is amorphous, but may be converted to a crystalline form using a laser beam of sufficient intensity to heat the material above the crystallization temperature. Subsequent exposure to a more intense and short laser pulse melts the crystallized chalcogenide phase-change material, resulting in a conversion to an amorphous state upon quenching. A recorded bit is an amorphized mark on a crystalline background. The reversibility of the crystallization-amorphization process allows for the fabrication of rewritable memory [A. V. Kolobov, "Understanding the phase change mechansim of rewritable optical media, Nature Mater., vol. 3, 703, 2004].

Generally the chalcogenide materials in the above-described applications are deposited using vacuum-based techniques such as sputtering or thermal evaporation. A solution-based process is desirable because of the reduced complexity of the process (reducing cost and improving throughput) and the ability to deposit on a wider range of substrate types (including those that have very large area or are flexible) and surface morphologies.

One disadvantage of the above-described hydrazine-precursor process is that it requires the isolation of the metal chalcogenide before the deposition-process can be initiated. Metal chalcogenides are often formed using high-temperature (energy-intensive) and/or multi-step (time-consuming) reactions. Given, the prevalence of multiple possible compositions for a given M and X, the formation of single phase metal chalcogenide starting materials can also be problematic. As an example, tin sulfide can exist as SnS or as $SnS_2$, or perhaps more appropriately as $SnS_{2-x}$ to accomodate the potential for non-stoichiometry ["Preparation and Characterization of $SnS_2$," J. Solid State Chem., vol. 76, 186]. The reaction of a 1:2 (molar) ratio of Sn and S at high temperature often yields $SnS_2$, in addition to impurities of SnS and S. The use of these $SnS_2$ materials for thin-film deposition may therefore lead to non-reproducibility since the exact composition of the starting metal chalcogenide may vary from run to run.

SUMMARY

The present disclosure relates to a method for preparing a solution of a hydrazine-based precursor of a metal chalcogenide which comprises adding an elemental metal and an elemental chalcogen to a hydrazine compound.

Another aspect of the present disclosure relates to a method of depositing a film of a metal chalcogenide which comprises:

preparing a solution of a hydrazine-based precursor of a metal chalcogenide which comprises adding an elemental metal and an elemental chalcogen to a hydrazine compound to provide a solution of said precursor of the metal chalcogenide;

applying a solution of said precursor onto a substrate to produce a film of said precursor; and annealing the film of the precursor to produce the metal chalcogenide film on the substrate.

The present disclosure also relates to a film prepared by the above disclosed method.

Another aspect of this disclosure is concerned with a method of preparing an improved field-effect transistor of the type having a source region and a drain region, a channel layer extending between the source region and the drain region, the channel layer including a semiconducting material, a gate region, disposed in spaced adjacency to the channel layer, an electrically insulating layer between the gate region the source region, drain region and channel layer. The method comprises: preparing a channel layer comprising a film of metal chalcogenide semiconducting material which comprises preparing a solution of a hydrazine-based precursor of a metal chalcogenide by adding an elemental metal and an elemental chalcogen to a hydrazine compound to provide a solution of said precursor of the metal chalcogenide; applying a solution of said precursor onto a substrate to produce a film of said precursor; and annealing the film of the precursor to produce the metal chalcogenide film on said substrate.

The present disclosure also relates to field-effect transistors obtained by the above method.

A still further aspect of the present disclosure relates to a photovoltaic device containing a layer or film of a metal chalcogenide obtained by the above-disclosed method.

Another aspect of the present disclosure is concerned with a phase-change memory device containing as a recording layer, a metal chalcogenide obtained by the above-disclosed method.

A still further aspect of the present disclosure relates to preparing a bulk metal chalcogenide by heating the metal chalcogenide precursor obtained by the above-disclosed method.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

BEST AND VARIOUS MODES

Figure 1:
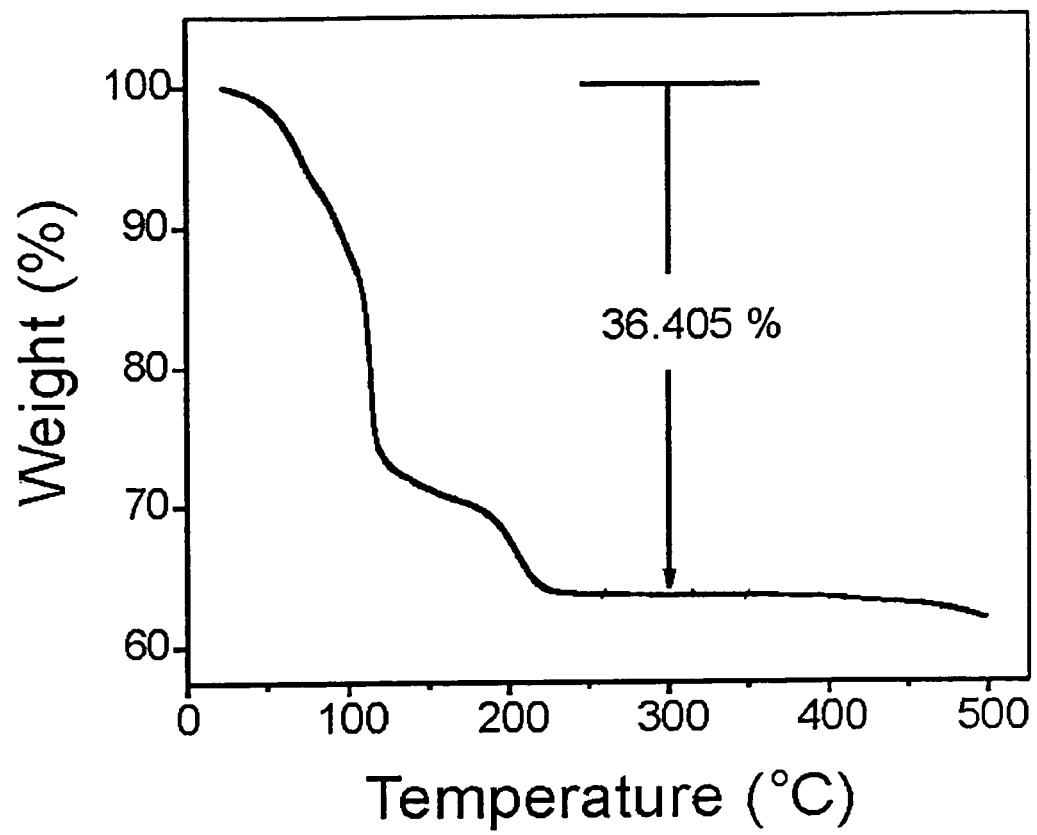
FIG. 1 is a thermogravimetric analysis (TGA) scan for the hydrazine-based $KSb_5S_8$ precursor.

The present disclosure relates to preparing a solution of a precursor of a metal chalcogenide. The method comprises adding an elemental metal and an elemental chalcogen to a hydrazine compound. Examples of suitable metals are both the transition and non-transition, metals and include tin, germanium, lead, indium, antimony, mercury, gallium, thallium, potassium, copper, iron cobalt, nickel, manganese, tungsten, molybdenum, zirconium, hafnium, titanium, and niobium or a combination thereof. The chalcogen is typically S, Se, Te or a combination thereof.

The elemental metal and elemental chalcogen are typically added in approximately stoichiometric amounts or with an excess of chalcogen, typically no more than about 150% more than needed for a stoichiometric mixture.

The present disclosure results in replacing the metal chalcogenide used in prior techniques with the corresponding elemental metal. The elemental metal combined with sufficient chalcogen results in dissolution of the metal in a hydrazine compound. The surprising aspect of this is that many metals may be directly dissolved in a hydrazine-type solvent at room temperature when sufficient chalcogen is added to the solvent. There is no need to first isolate the metal chalcogenide for use in the preparation of the chalcogenide precursor solution.

The present disclosure makes possible a high throughput/low-temperature solution-based deposition of high quality metal chalcogenide films for a variety of electronic applications (e.g., phase-change memory, solar cell, LED and thin film transistor).

Moreover, the present disclosure differs significantly from the earlier disclosed use of hydrazine hydrate as a solvent for the precipitation of certain metal sulfides and selenides (e.g., zinc sulfide, copper selenide, silver-doped zinc sulfide, copper-doped zinc cadmium sulfide) [U.S. Pat. No. 6,379,585 to Vecht et al., "Preparation of Sulfides and Selenides"]. In the case of U.S. Pat. No. 6,379,585, the solvent (which always involves water, as well as hydrazine) generally enables the precipitation of a metal chalcogenide, rather than the dissolution of the metal chalcogenide for further solution processing into thin film form. In addition, that process did not involve the use of elemental metals, but rather required metal salts, which could introduce impurities into the final product.

The solutions of metal chalcogenide hydrazine-based precursors can be prepared by stirring the elemental metal (e.g., Sn, Ge, Pb, In, Sb, Hg, Ga, Tl, K, Rb and Cs) or combinations of elemental metals in a mixture of hydrazine and chalcogen (e.g., S, Se, Te) to yield the desired metal chalcogenide solution. It is often desirable to add extra chalcogen (in excess of a stoichiometric quantity to produce the desired $M_yX_z$ chalcogenide system) to the solvent to improve the solubility of the metal in the hydrazine-based solvent. Generally the stirring is performed at room temperature, although gentle heating such as up to about 95 C may also facilitate dissolution. In the case a highly reactive metal such as potassium, it might be desirable to carry out the stirring (i.e. the reaction) at reduced temperatures for instance down to about 5 C.

Certain of the metals such as potassium cause a highly exothermic reaction to occur upon contact with hydrazine.

One method to overcome the highly exothermic nature of the reaction between potassium and hydrazine is to have the potassium physically removed from the bottom of the reaction vessel (e.g., K is "sticky" at room temperature and will effectively stick to the side of the glass walls of the reaction flask). Then, when the hydrazine drops are placed on the bottom of the reaction flask, the vapors can first be allowed to react, followed by gentle agitation of the vessel, allowing some of the drop to gradually come into contact with the remaining potassium. Further techniques to accommodate the highly exothermic nature of the reaction are to dilute the hydrazine with an appropriate cosolvent such as an alkanol amine and/or to cool the reaction flask.

The concentration of the metal chalcogenide precursor in the hydrazine compound is typically no more than about 10 molar and more typically about 0.01 molar to about 10 molar, even more typically about 0.05 to about 5 molar, or about 0.05 to about 1 molar.

Typical hydrazine compounds are represented by the formula:

$$R^1R^2N-NR^3R^4$$

Wherein each of $R^1$, $R^2$, $R^3$ and $R^4$ is independently hydrogen, aryl such as phenyl, a linear or branched alkyl having 1-6 carbon atoms such as methyl, ethyl or a cyclic alkyl of 3-6 carbon atoms.

The most typical solvent is hydrazine. The present disclosure is not limited to the use of hydrazine, but it can also be used with hydrazine-like solvents, as disclosed above, such as 1,1-dimethylhydrazine and methylhydrazine or mixtures of hydrazine-like solvents with other solvents including, but not limited to, water, methanol, ethanol, acetonitrile and N,N-dimethylformanide. However, with certain highly-reactive metals, e.g. K and other alkali metals, it is preferred that the solvent be anhydrous.

The metal chalcogenide can be formed from its precursor, after evaporating the solvent, by heating typically up to about 100-500° C. and more typically up to about 150-350° C. The precursor solutions can advantageously be used towards the preparation of bulk metal chalcogenides that find particular applicability in phase-change memory applications. For instance using the solution-based technique of this disclosure, bulk metal chalcogenides can be prepared at temperatures <350 C after evaporation of the solvent and typically at temperatures of about 150 to <250 C. On the other hand, the preparation of, for example, bulk $KSb_5S_8$ is generally carried out at ~850 C ["$KSb_5S_8$: A Wide Bandgap Phase-Change Material for Ultra High Density Rewritable Information Storage," Adv. Mater., vol. 15, 1428, 2003].

The solution of the metal chalcogenide precursor can be applied to a substrate. The substrate may be rigid or flexible and the deposition process may be by any solution-based technique including, but not limited to, doctor blading, spin coating, ink-jet printing, stamping, dip-coating.

Typically, the substrate is fabricated from a material having at least one property selected from the following: thermally stable, i.e., stable up to about at least 300° C.; chemically inert towards the metal chalcogenides; rigid or flexible. Suitable examples include Kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon—germanium, indium tin oxide, boron carbide, boron nitride, silicon nitride ($Si_3N_4$), alumina ($Al_2O_3$), cerium (IV) oxide ($CeO_2$), tin oxide ($SnO_2$), zinc titanate ($ZnTiO_2$), a plastic material or a combination thereof. More typically, the metal substrate is a metal foil, such as, aluminum foil, tin foil, stainless steel foil and gold foil, and the plastic material more typically is polycarbonate, Mylar or Kevlar.

The hydrazine-based precursor on the substrate is then subjected to a low-temperature thermal treatment or annealing to decompose the precursor to the metal chalcogenide.

The thermal treatment is typically between 100-500° C. (more typically, between 150-350 C) and for an amount of time just sufficient to decompose the precursor and effect sufficient grain growth. In some cases (for certain applications that might require an amorphous film), the thermal treatment is carried out at an appropriate temperature that is high enough for thermal decomposition of the precursor, but low enough to enable the film to remain in an amorphous state. Typically, the thermal treatment is for an amount of time between 1 sec-1 hr. More typically, the thermal treatment is for 5-30 min. The thermal treatment may be applied using a hot plate, oven (tube- or box-type), laser-based rapid annealing or microwave-based heating. The thermal treatment yields an amorphous or crystalline film of the desired metal chalcogenide, with the loss of hydrazine and hydrazinium chalcogenide (and/or the decomposition products of these compounds).

The present disclosure has the advantage relative to U.S. Pat. No. 6,875,661 and Patent Publications 2005-0009225 and 2005-0158909, mentioned above that it is not necessary to purchase or synthesize the metal chalcogenide material, which often requires high temperature and/or multiple step synthetic processes for its preparation. Rather the corresponding metal is simply employed High purity samples of most metals are readily available from chemical suppliers (the corresponding metal chalcogenides are sometimes difficult to purchase commercially). Generally, much higher purity metals can be purchased, when compared with the corresponding purchased metal chalcogenide. Better reproducibility of the properties of the resulting films is therefore expected.

The present disclosure may be used for the preparation of materials or components for a variety of electrical devices, including phase-change memory devices (e.g., optical rewritable memory or PRAM), transistors, solar cells or LEDs.

The films prepared by the present disclosure can be removed from the substrate to produce an isolated film thereof.

The present disclosure provides a thin-film field-effect transistor (FET) having a film of a metal chalcogenide semiconducting material as the active semiconducting layer. The present disclosure provides a method of preparing an improved field-effect transistor of the type having a source region and a drain region, a channel layer extending between the source region and the drain region, the channel layer including a semiconducting material, a gate region disposed in spaced adjacency to the channel layer, an electrically insulating layer between the gate region and the source region, drain region and channel layer, wherein the method includes: preparing a channel layer including a film of a solution-processed metal chalcogenide semiconducting material of the present disclosure.

Figure 4A:
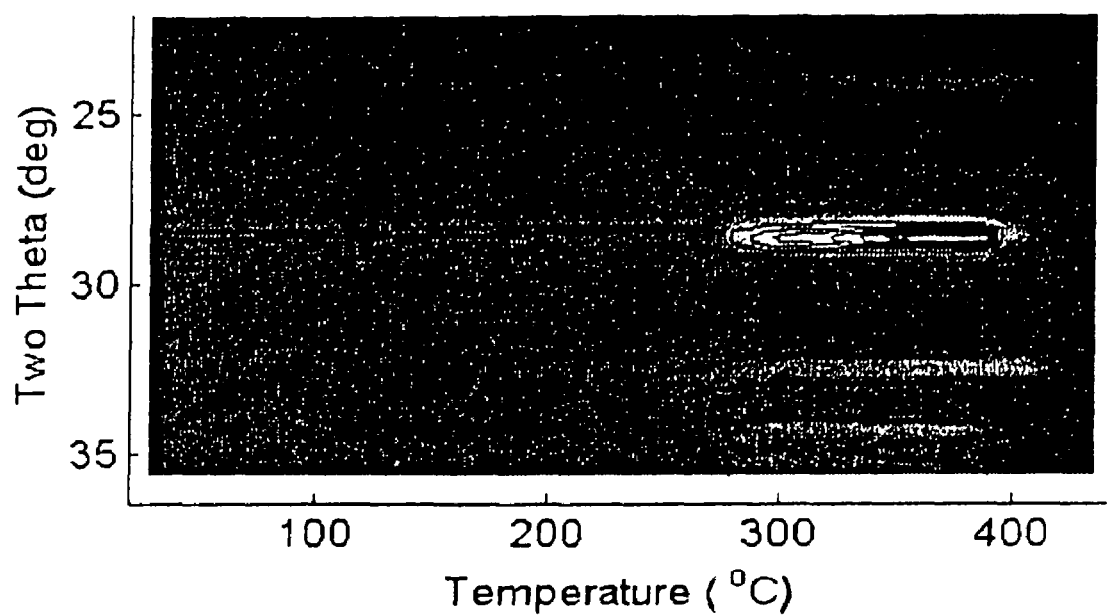
FIGS. 4(a), 4(b) and 4(c) illustrates three cycles of variable-temperature x-ray diffraction ($\lambda=1.797$ Å) of a $KSb_5S_8$ film after melting and quenching (warming curves; same film as in FIG. 3).
Figure 4B:
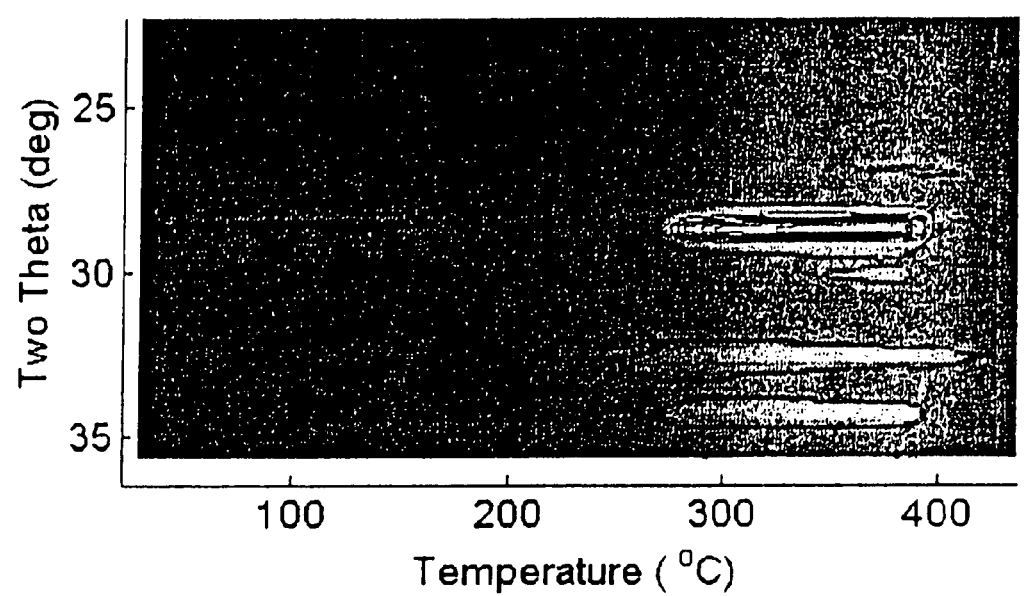
Figure 4C:
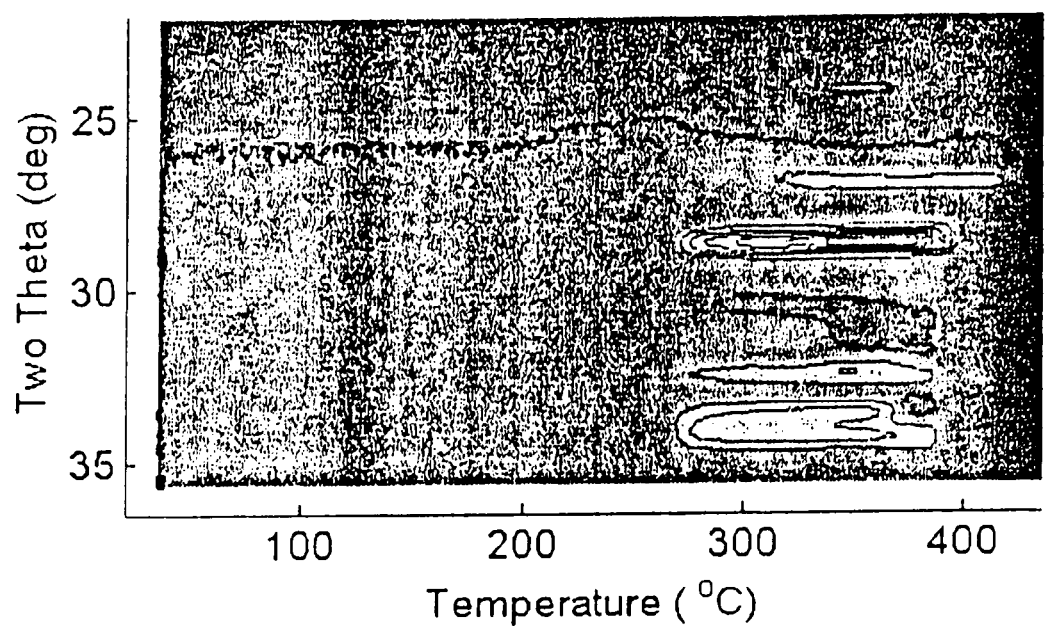

In one embodiment, the source region, channel layer and drain region are typically disposed upon a surface of a substrate, the electrically insulating layer is disposed over the channel layer and extending from the source region to the drain region, and the gate region is disposed over the electrically insulating layer, for example, as shown in FIG. 4 of the U.S. Pat. No. 6,180,956, the disclosure of which are incorporated herein by reference.

Figure 3:
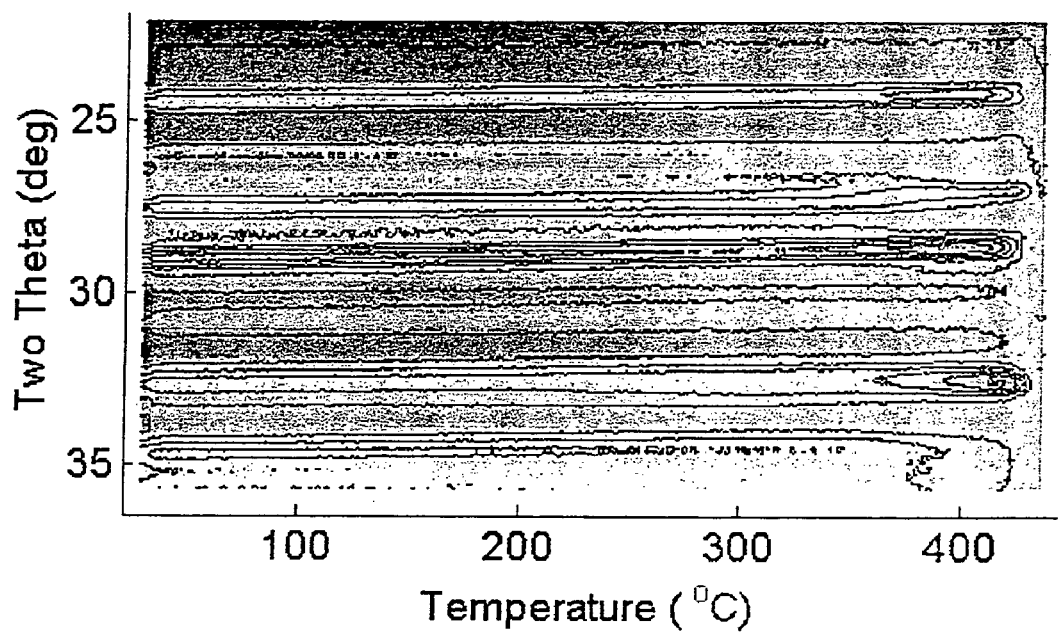
FIG. 3 illustrates variable-temperature (warming curve) X-ray diffraction ($\lambda=1.797$ Å) of the $KSb_5S_8$ films deposited using the method described in this disclosure.

In another embodiment, the gate region is disposed as a gate layer upon a surface of a substrate, the electrically insulating layer is disposed upon the gate layer, and the source region, channel layer, and drain region are disposed upon the electrically insulating layer, for example, as shown in FIG. 3 of the previously incorporated U.S. Pat. No. 6,180,956.

The metal chalcogenide semiconducting material may be in the form of a thin film, in which the metal chalcogenide semiconducting material is a polycrystalline material having a grain size equal to or greater than the dimensions between contacts in the semiconductor device. Accordingly, the present disclosure can provide an improved field-effect transistor prepared by the aforementioned method.

Photovoltaic cells might be constructed, incorporating the various methods of this disclosure, by layering the metal chalcogenide with other materials to form a two terminal, sandwich-structure device. For example, one could form a layer of $CuInS_xSe_{2-x}$, deposited as disclosed herein on top of a metal contact, such as Mo which is supported on a rigid or flexible substrate (e.g. glass, metal, plastic). The $CuInS_xSe_{2-x}$ layer could then be covered with a buffer layer, which can be a metal chalcogenide such as CdS or ZnSe or an oxide such as $TiO_2$. This buffer layer could be deposited in the same fashion as the $CuInS_xSe_{2-x}$ layer using any of the methods of the present disclosure or it could be deposited more conventionally (e.g. by chemical bath or vapor deposition techniques). The buffer layer would then be covered with a transparent top contact such as doped $TiO_2$, indium tin oxide, or fluorine-doped tin oxide, completing the photovoltaic cell.

Alternatively, the cell could be constructed in the reverse order, using a transparent substrate (e.g. glass or plastic) supporting a transparent conducting contact (such as doped $TiO_2$, indium tin oxide, or fluorine-doped tin oxide). The buffer layer would then be deposited on this substrate and covered with the metal chalcogenide layer (such as $CuInS_xSe_{2-x}$ or CdTe), and finally with a back contact (such as Mo or Au). In either case, the buffer layer and/or the metal chalcogenide ("absorber") layer could be deposited by the methods described in this disclosure.

Metal chalcogenides obtained by the above-disclosed method can also be used as a recording layer in phase change memory devices such as those disclosed and referenced in WO 2004/067624, disclosure of which is incorporated herein by reference. The phase change memory devices typically include the chalcogenide-based phase-change memory material supported on a substrate and protected by other insulating or conducting layers (depending upon the application).

In the addition, the process of the present disclosure can be combined with the modes disclosed in U.S. Ser. No. 11/330,291 filed Jan. 12, 2006 and entitled "Method for Fabricating an Inorganic NanoComposite, entire disclosure of which is incorporated herein by reference, to enable the deposition of inorganic nanocomposites comprising a metal chalcogenide matrix molecularly interspersed with nanoentities (nanorods, nanoparticles, nanowires, nanotetrapods, etc.). In this case, the nanoentities would be added to the metal chalcogenide precursor solution before depositing the film.

The following non-limiting examples are presented to further illustrate the present disclosure.

EXAMPLE 1

$KSb_5S_8$

Figure 2:
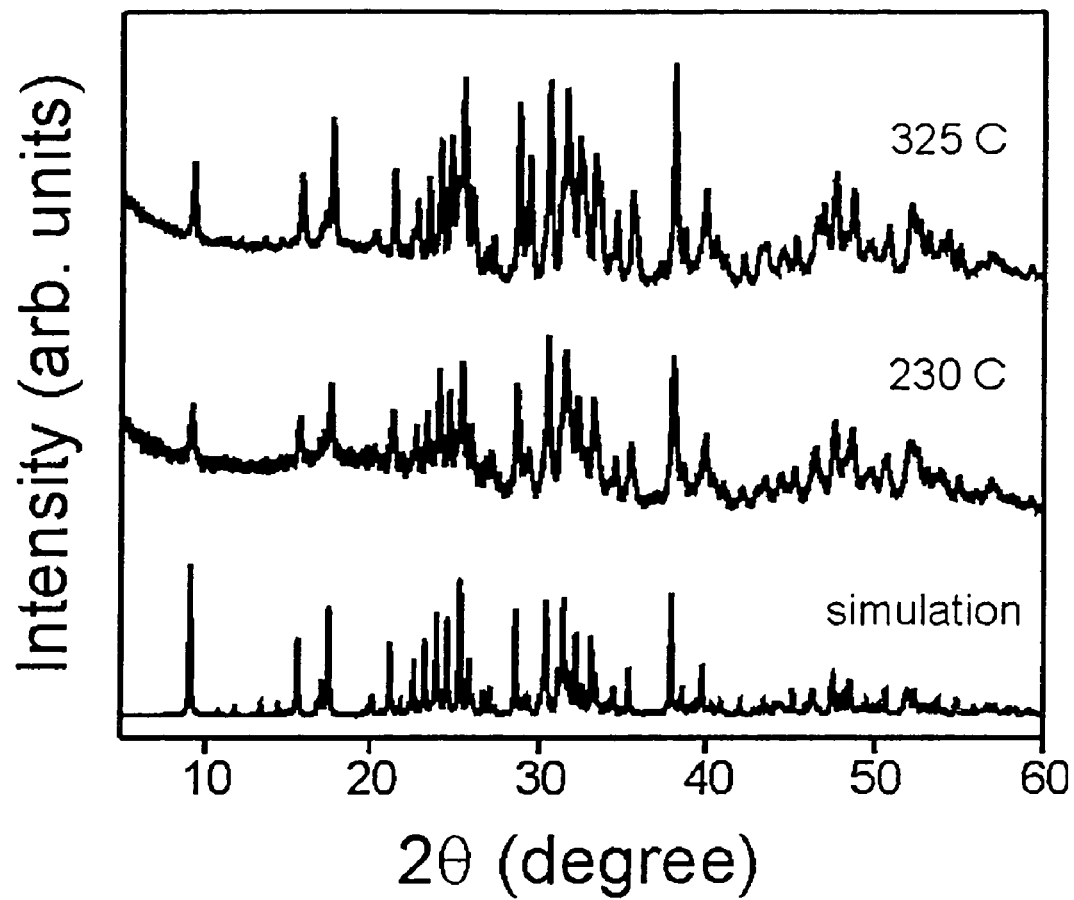
FIG. 2 shows powder X-ray diffraction patterns (acquired at a wavelength of $\lambda=1.54$ Å) for the $KSb_5S_8$ precursor after TGA runs terminated at either 230° C. or 325° C., demonstrating the formation of crystalline $KSb_5S_8$.

Under rigorously inert atmosphere conditions, 0.5 mmol of elemental K (19.6 mg; Alfa Aesar, 99.95%, ampouled under Ar) are combined with 2.5 mmol Sb (304.4 mg; Alfa Aesar; 99.999%,-200 mesh), 8.0 mmol S (256.5 mg; Aldrich, 99.998%) and 1.0 mL anhydrous distilled hydrazine. The hydrazine is added very carefully (drop-by-drop and very slowly) to accommodate the highly exothermic reaction. The mixture is stirred for 5 days at room temperature in a nitrogen-filled dry box, forming an essentially clear relatively viscous yellow solution (a tiny amount of black precipitate or undissolved material is still present but can be easily removed using a filter). For bulk analysis of the precursor, the solution is evaporated under flowing nitrogen gas and under vacuum, yielding a very viscous darkly-colored gum-like product. Thermal decomposition of the product (FIG. 1) yields the phase-change material $KSb_5S_8$ (FIG. 2). FIG. 1 is a thermogravimetric analysis (TGA) scan for the hydrazine-based $KSb_5S_8$ precursor, performed using a 1° C./min heating rate and a flowing nitrogen atmosphere. FIG. 2 shows powder X-ray diffraction patterns ($\lambda$=1.54 Å) for the $KSb_5S_8$ precursor after TGA runs terminated at either 230° C. or 325° C., demonstrating the formation of crystalline $KSb_5S_8$. The bottom curve in FIG. 2 is a calculated diffraction pattern, based on a published single crystal structure for $KSb_5S_8$ [The Crystal Structures of Synthetic $KSb_5S_8$ and $(Tl_{0.598}K_{0.402})Sb_5S_8$ and Their Relation to Parapierrotite (Tl $Sb_5S_8$), Z. Kristallogr., vol. 214, 57, 1999]. The thermal decomposition corresponds to the loss of approximately 36.4% of the initial precursor weight. Note also that the thermal decomposition is complete by approximately 220° C., rendering this a fairly low-temperature process.

One method to overcome the highly exothermic nature of the reaction between potassium and hydrazine is to have the potassium physically removed from the bottom of the reaction vessel (e.g., K is "sticky" at room temperature and will effectively stick to the side of the glass walls of the reaction flask). Then, when the hydrazine drops are placed on the bottom of the reaction flask, the vapors can first be allowed to react, followed by gentle agitation of the vessel, allowing some of the drop to gradually come into contact with the remaining potassium. Further techniques to accommodate the highly exothermic nature of the reaction are to dilute the hydrazine with an appropriate cosolvent and/or to cool the reaction flask.

$KSb_5S_8$ is both a potentially important phase-change material, as well as an example of a ternary compound being synthesized using the process.

EXAMPLE 2

Thin Film Deposition of $KSb_5S_8$

For thin-film deposition, the above-described solution proved too viscous for effective thin-film deposition by spin coating. The solution is therefore diluted by adding an additional 3 mL of distilled hydrazine. Films can then be spin coated from the hydrazine-based solution onto Si substrates (2 cm×2 cm), coated with approximately 100 nm of thermal oxide ($SiO_x$). The substrates are cleaned using a Piranha process (4:1 $H_2SO_4$: 30% $H_2O_2$ by volume) to provide a clean hydrophilic surface so that the $KSb_5S_8$ solution adequately wets the surface during the spinning process. The films are spin coated in a nitrogen-filled drybox by depositing two drops of the chalcogenide-based solution on the substrate and spin coating at between 2500-5000 rpm. The exact spin speed influences the thickness of the resulting films. After spin coating, the resulting films are dried at 100° C. for approximately 5 min, then gradually heated to 225° C. over a period of 10 min and maintained at this temperature for 15 min. This heat treatment decomposes the precursor, resulting in the desired crystalline $KSb_5S_8$ films.

The $KSb_5S_8$ films, deposited using the hydrazine-based solution as described above, exhibit the expected phase-change properties. FIG. 3 shows a segment ($2\theta$ range) of the powder X-ray diffraction pattern (FIG. 2), as a function of temperature. FIG. 3 is a variable-temperature (warming curve) X-ray diffraction pattern ($\lambda$=1.797 Å) of the $KSb_5S_8$ film, deposited using the method described in this disclosure (using 2500 rpm spin speed). The film was rapidly cooled to room temperature after melting. The diffraction pattern effectively disappears above ~448° C., the expected melting temperature of $KSb_5S_8$ ["$KSb_5S_8$: A Wide Bandgap Phase-Change Material for Ultra High Density Rewritable Information Storage," Adv. Mater., vol. 15, 1428 (2003)]. Upon cooling, the film is effectively quenched into an amorphous state (i.e., no diffraction peaks at low temperature in FIG. 4*a*). Warming the resulting amorphous films leads to an amorphous-crystallization transition at ~287 C, consistent with the literature value (FIG. 4). Above the melting point, the film again enters the amorphous state. Three thermal cycles, FIGS. 4(*a*), 4(*b*) and 4(*c*) are shown, demonstrating the reversibility of the amorphous-to-crystalline transition. FIG. 4 is a variable-temperature X-ray diffraction pattern ($\lambda$=1.797 Å) of a $KSb_5S_8$ film after melting and quenching (warming curves; same film as in FIG. 3). The film was subsequently quenched to room temperature after each warming segment. This is proof that the films indeed consist of a phase-change material, potentially suitable for use in rewritable optical memory and other phase-change memory applications.

EXAMPLE 3

Figure 5:
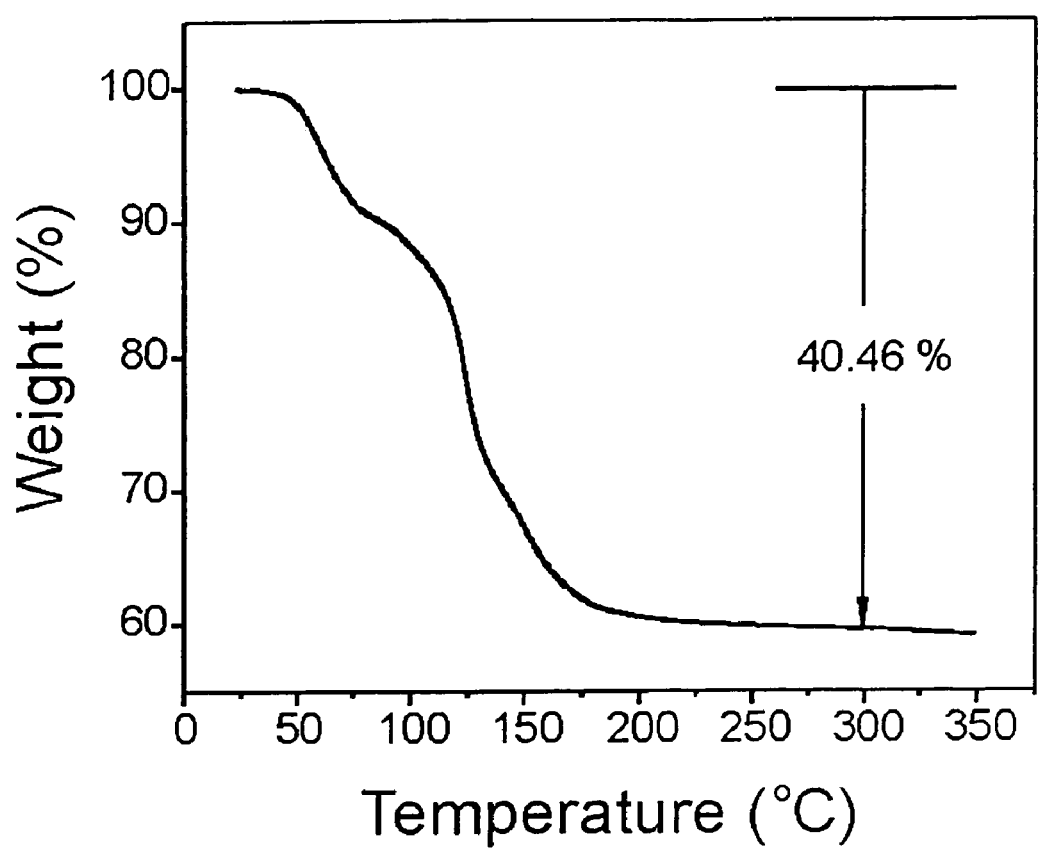
FIG. 5 is a thermogravimetric analysis (TGA) scan for the hydrazine-based tin sulfide precursor.
Figure 6:
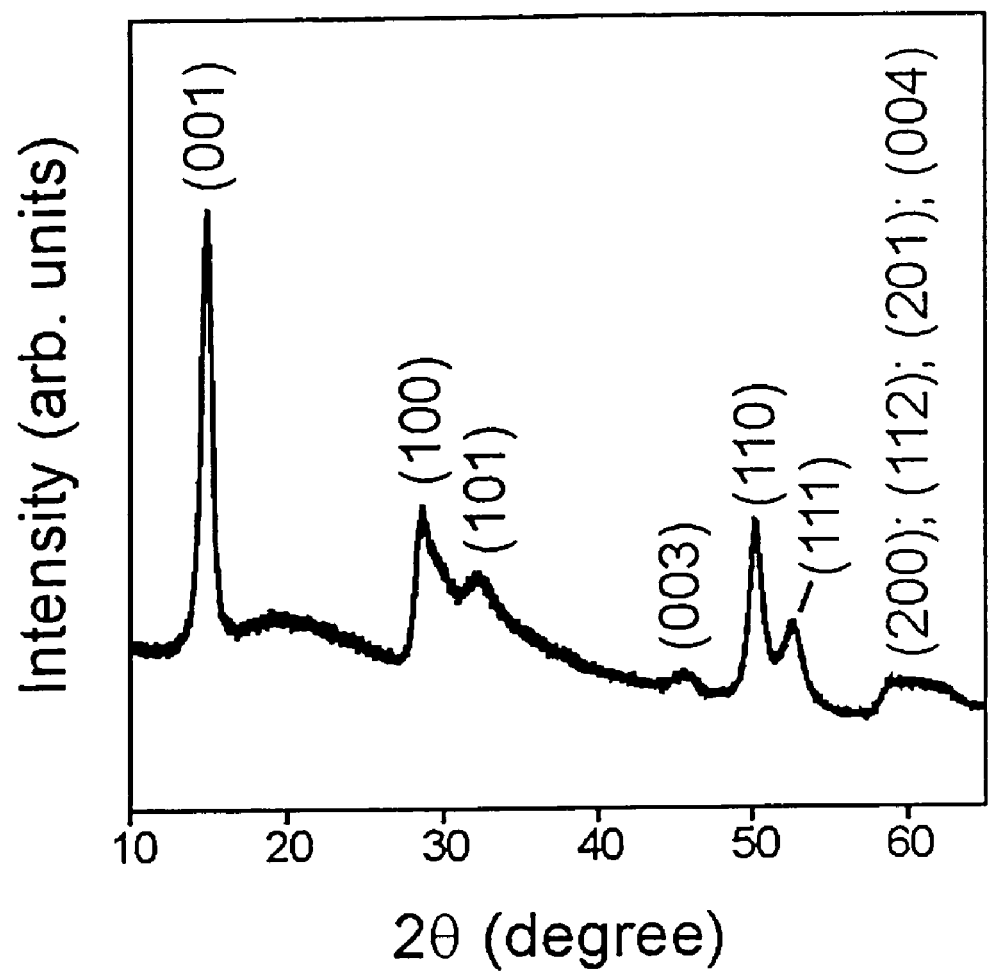
FIG. 6 is a powder X-ray diffraction pattern for the $SnS_2$ precursor after a TGA run terminated at 350° C. (from FIG. 5), demonstrating the formation of crystalline $SnS_2$.

$SnS_2$ 2 mmol elemental Sn (237.4 mg; Aldrich, tin shot, 99.999%) are combined with 8 mmol elemental S (256.5 mg; Aldrich, 99.998%) and 4 mL anhydrous distilled hydrazine. The mixture is stirred at room temperature in a nitrogen-filled glove box (water and oxygen levels below 1 ppm) for a period of approximately 4 days, yielding a clear very pale yellow solution. The solution may be used for solution-processing of tin sulfide films and devices as described below. For bulk characterization, the solution was evaporated under flowing nitrogen gas for approximately 18 hr and further dried under vacuum, yielding approximately 591 mg of a white or pale yellow powder. Upon thermal decomposition of the precursor powder (~40.5% weight loss), $SnS_2$ (or $SnS_{2-x}$) is recovered (FIGS. 5 and 6). FIG. 5 is a thermogravimetric analysis (TGA) scan for the hydrazine-based tin sulfide precursor, performed using a 2 C/min heating rate and a flowing nitrogen atmosphere. FIG. 6 is a powder X-ray diffraction pattern for the $SnS_2$ precursor after a TGA run terminated at 350 C (from FIG. 5), demonstrating the formation of crystalline $SnS_2$. The reflection indices are taken from the known powder pattern for Berndtite. Relatively broad peaks in the X-ray diffraction pattern (FIG. 6) indicate a small grain size for the polycrystalline product.

EXAMPLE 4

Thin Film Deposition of $SnS_2$

Thin tin sulfide films are also deposited from an analogous solution to that described above. 0.12 mmol of Sn (14.24 mg; Aldrich, tin shot, 99.999%) are combined with 0.50 mmol S (16.03 mg; Aldrich, 99.998%) and 1.8 mL hydrazine (distilled). The mixture is stirred for approximately 2 days, yielding an essentially colorless solution. The films are spin-coated on Si substrates (2 cm×2 cm), each coated with approximately 40 nm of thermal oxide ($SiO_x$), which have been cleaned using a Piranha process (4:1 $H_2SO_4$: 30% $H_2O_2$ by volume). The important aspect of the cleaning process is to provide a clean hydrophilic surface so that the tin sulfide solution will adequately wet the surface during the spinning process. The films are spin coated in a nitrogen-filled dry box by depositing two drops of the chalcogenide solution on the substrate and spin coating at between 1000-4000 rpm. The exact spin speed influences the thickness of the resulting film. After spin coating the resulting films are dried at 120° C. for approximately 5 min and then heat treated at between 250-350° C. to affect the thermal decomposition of the precursor to tin sulfide. The final annealing temperature can also be used to tailor the grain size of the film and influence the resulting film electrical characteristics.

EXAMPLE 5

Field Effect Transistor

Figure 7:
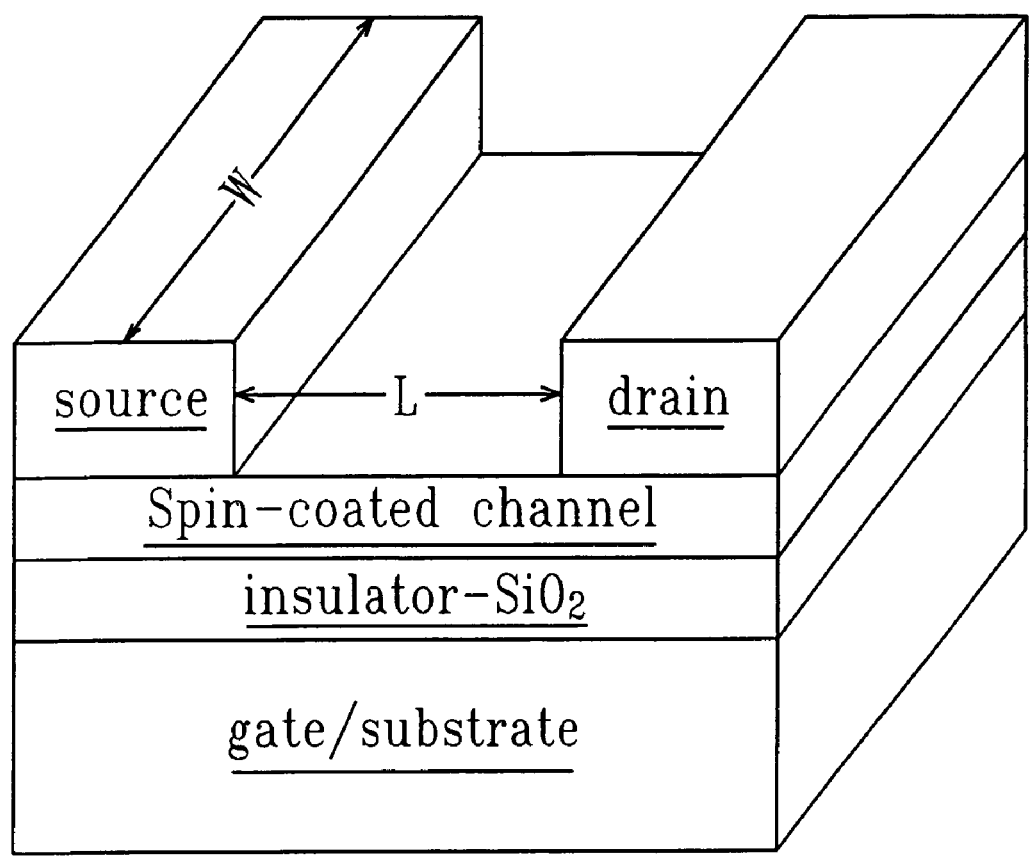
FIG. 7 is a schematic of the thin-film transistor (TFT) with a spin-coated tin sulfide channel.

A characteristic tin sulfide film, prepared as described above with a 3000 rpm spin speed and a 325 C final heat treatment temperature was used as the channel layer in a thin-film transistor (TFT). The transistor comprises (see FIG. 7) a heavily n-doped silicon wafer as the substrate/gate, a 40-nm-thick thermally grown $SiO_2$ gate dielectric, the spin-coated tin sulfide channel layer and patterned electron-beam-evaporated Au source and drain electrodes.

Figure 8:
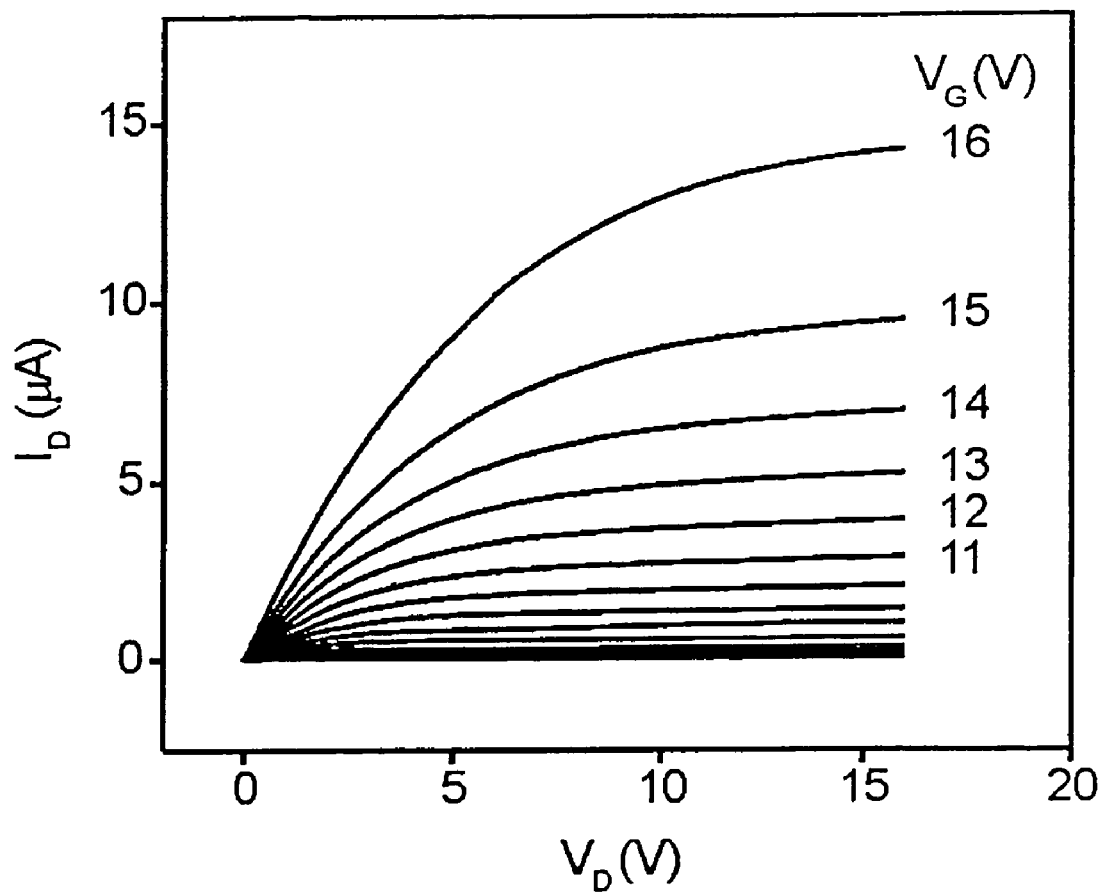
FIG. 8 illustrates Drain current, $I_D$, versus drain voltage, $V_D$, as a function of gate voltage, $V_G$, for a spin-coated tin sulfide channel layer deposited according to this disclosure.

A representative plot of drain current, $I_D$, versus drain voltage, $V_D$, is shown in FIG. 8 as a function of the applied gate voltage, $V_G$, for a TFT with a tin sulfide channel formed from the solution described above (the channel length, L=25 μm, and channel width, W=1000 μm).

Figure 9:
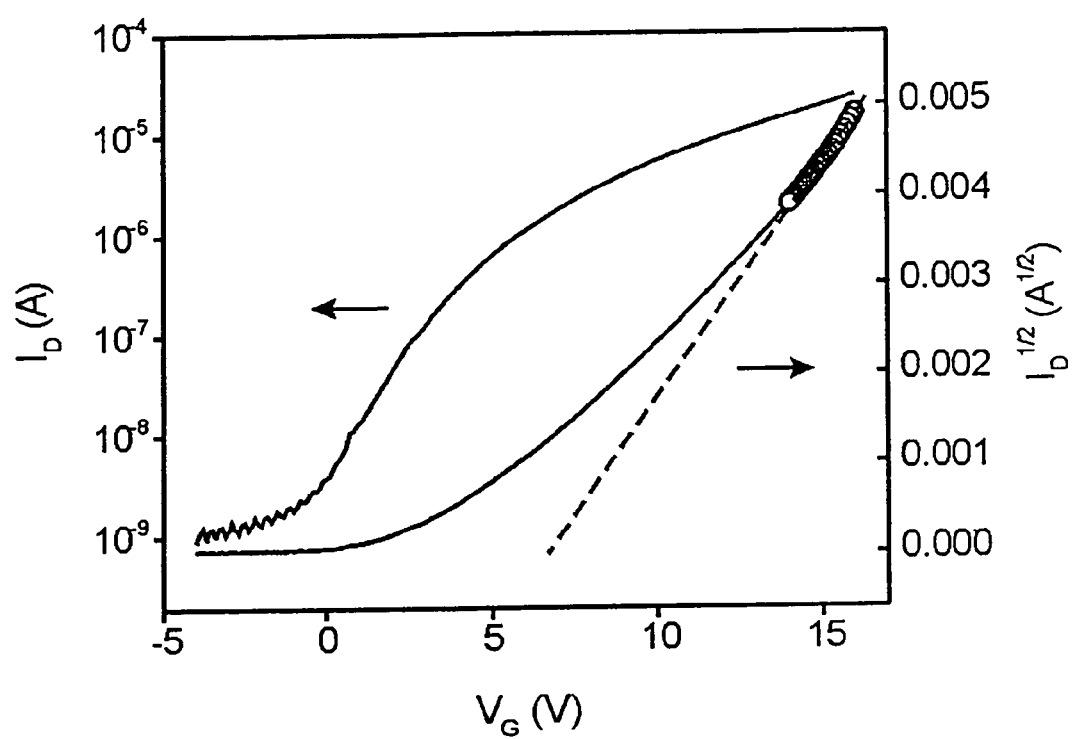
FIG. 9 is a plot of $I_D$ and $I_D^{1/2}$ versus $V_G$ at a constant $V_D=16V$, used to calculate current modulation, $I_{on}/I_{off}$, and saturation regime mobility, $\mu_{sat}$, for a tin sulfide channel. The dashed line indicates the slope used to calculate mobility in the saturation regime.

The device operates as an n-channel transistor, operating in accumulation mode upon application of a positive gate bias. Application of a negative gate bias depletes the channel of electrons and shuts the device off. At low $V_D$, the TFT shows typical transistor behavior as $I_D$ increases approximately linearly with $V_D$. Current saturation, with a small ohmic component, is observed at high $V_D$ as the accumulation layer is pinched off near the drain electrode. Current modulation ($I_{ON}/I_{OFF}$) and saturation regime field-effect mobility ($\mu_{sat}$) are calculated from the plot of $I_D$ and $I_D^{1/2}$ versus $V_G$ (FIG. 9), yielding $I_{ON}/I_{OFF}$=2×10$^4$ and $\mu_{sat}$=0.14 cm$^2$/V-s, respectively, for a −4 to 16 V gate sweep and $V_D$=16 V. The dashed line in FIG. 9 indicates the slope used to calculate mobility in the saturation regime. Note that use of a thinner or higher dielectric constant gate insulator (relative to the 400 Å $SiO_2$ layer currently used) is expected to enable reduction in the device operating voltage. The linear regime mobility derived from the plots in FIG. 8, $\mu_{lin}$=0.12 cm$^2$/V-s, is only slightly lower than the saturation regime value.

EXAMPLE 6

Figure 10:
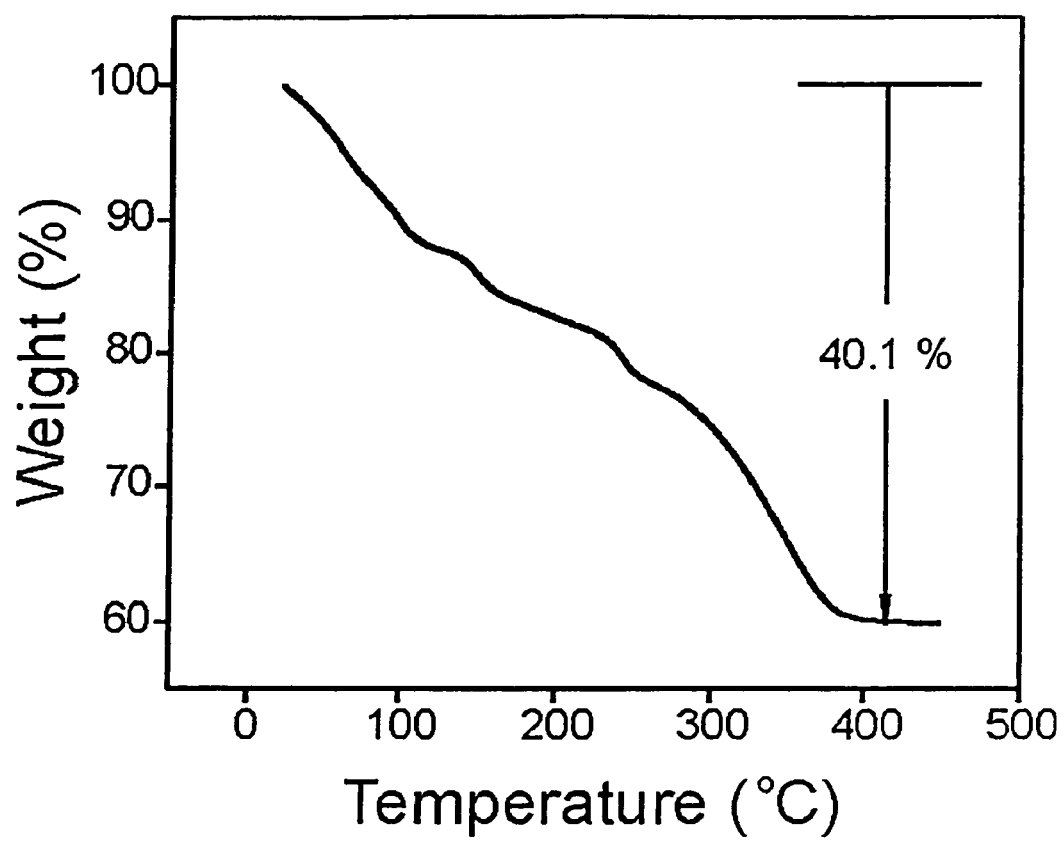
FIG. 10 is a thermogravimetric analysis (TGA) scan for the hydrazine-based $Ga_2Se_3$ precursor.
Figure 11:
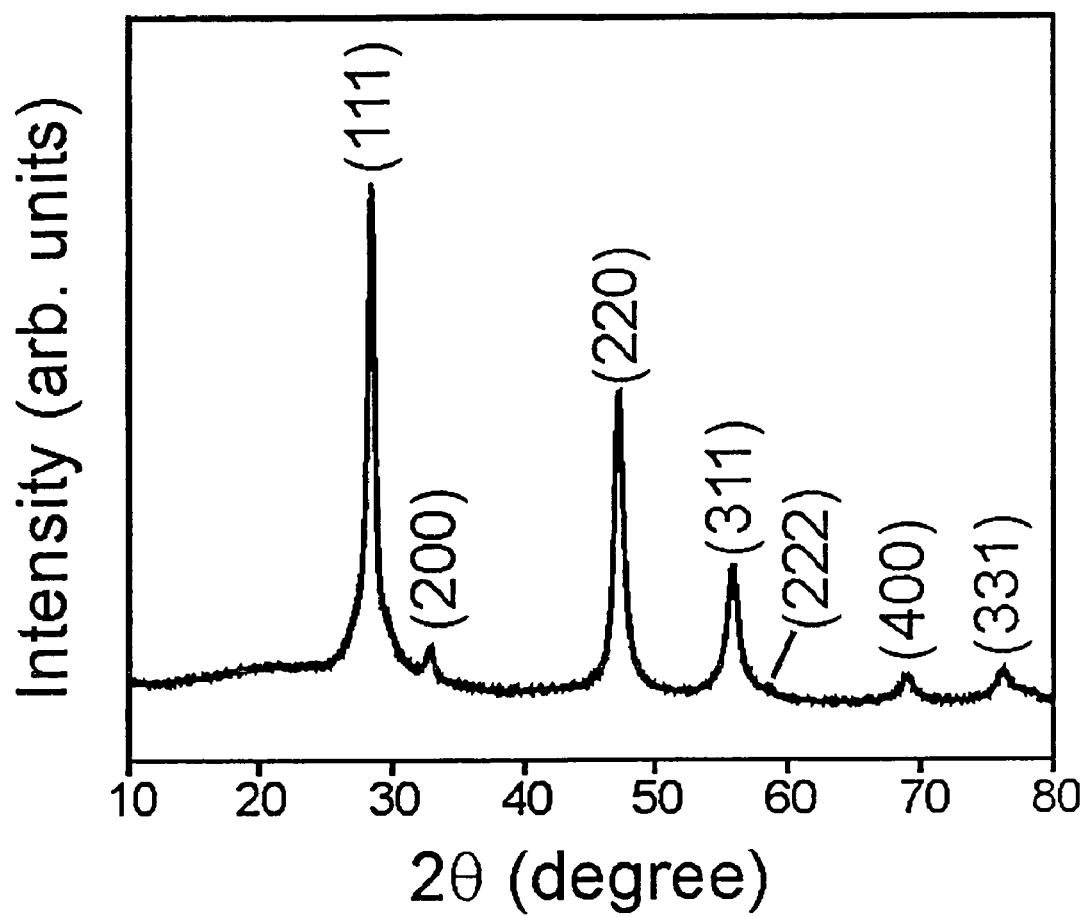
FIG. 11 is a powder X-ray diffraction pattern for the $Ga_2Se_3$ precursor after a TGA run terminated at 375° C., demonstrating the formation of crystalline $Ga_2Se_3$.

Ga$_2$Se$_3$ 1.5 mmol of elemental Ga (104.58 mg) are combined with 3 mmol elemental Se (236.88 mg) and 2 mL anhydrous hydrazine. The mixture is stirred at room temperature in a nitrogen-filled glovebox (water and oxygen levels below 1 ppm) for a period of two weeks. The initially dark solution eventually becomes a clear yellow with only a very small piece of the undissolved metal on the bottom of the reaction flask. The resulting yellow solution can be used (as described above for SnS$_2$ and KSb$_5$S$_8$) for the deposition of Ga$_2$Se$_3$ films. Bulk Ga$_2$Se$_3$ is formed by evaporating the solution and heating the resulting precursor to 375° C. (FIGS. 10 and 11). FIG. 10 is a thermogravimetric analysis (TGA) scan for the hydrazine-based Ga$_2$Se$_3$ precursor, performed using a 1 C/min heating rate and a flowing nitrogen atmosphere. FIG. 11 is a powder X-ray diffraction pattern ($\lambda$=1.54 Å) for the Ga$_2$Se$_3$ precursor after a TGA run terminated at 375 C, demonstrating the formation of crystalline Ga$_2$Se$_3$. The reflection indices are taken from the known powder pattern for $\alpha$-Ga$_2$Se$_3$.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The embodiments described hereinabove are further intended to explain best modes known of practicing the invention and to enable others skilled in the art to utilize the disclosure in such, or other, embodiments and with the various modifications required by the particular applications or uses disclosed herein. Accordingly, the description is not intended to limit the invention to the form disclosed herein. Also, it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In the case of inconsistencies, the present disclosure will prevail.

What is claimed as new and desired to be protected by Letters Patent of the United States is:

1. A method of preparing a solution of a hydrazonium precursor of a metal chalcogenide which comprises adding an elemental metal and an elemental chalcogen to a hydrazine compound.

2. The method of claim 1 wherein the concentration of the metal chalcogenide precursor in the hydrazine compound is no more than about 10 molar.

3. The method of claim 1 wherein the concentration of the metal chalcogenide precursor in the hydrazine compound is about 0.01 molar to about 10 molar.

4. The method of claim 1 concentration of the metal chalcogenide precursor in the hydrazine or about 0.05 to about 1 molar.

5. The method of claim 1 wherein the hydrazine compound is represented by the formula;

$$R^1R^2N-NR^3R^4$$

wherein each of $R^1, R^2, R^3$ and $R^4$ is independently hydrogen, aryl, a linear or branched alkyl having 1-6 carbon atoms or a cyclic alkyl of 3-6 carbon atoms.

6. The method of claim 1 wherein the hydrazine compound comprises hydrazine.

7. The method of claim 1 which comprises reacting vapors of the hydrazine compound with the elemental metal.

8. The method of claim 1 wherein said metal chalcogenide comprises KSb$_5$S$_8$.

9. The method of claim 1 wherein said metal chalcogenide comprises SnS$_2$.

10. The method of claim 1 wherein said metal chalcogenide comprises Ga$_2$Se$_3$.

11. The method of claim 1 wherein said hydrazine compound is substantially anhydrous.

12. A method of depositing a film of a metal chalcogenide which comprises preparing a solution of a hydrazinuim precursor of a metal chalcogenide which comprises adding an elemental metal and an elemental chalcogen to a hydrazine compound to provide a solution of said precursor of the metal chalcogenide;
applying a solution of said precursor onto a substrate to produce a film of said precursor; and annealing the film of the precursor to produce the metal chalcogenide film on the substrate.

13. The method of claim 12 wherein the annealing is carried out at temperatures of about 50 to about 500°C.

14. The method of claim 12 wherein the annealing is carried out at temperatures of about 100 to about 350°C.

15. The method of claim 12 wherein the concentration of the metal chalcogenide precursor in the hydrazine compound is no more than about 10 molar.

16. The method of claim 12 wherein the hydrazine compound is represented by the formula;

$$R^1R^2N-NR^3R^4$$

wherein each of $R^1, R^2, R^3$ and $R^4$ is independently hydrogen, aryl, hydrogen,aryl,a linear or branched alkyl having 1-6 carbon atoms or a cyclic alkyl of 3-6 carbon atoms.

17. The method of claim 12 wherein the hydrazine compound comprises hydrazine.

18. A film prepared by the method of claim 12.

19. A method of preparing an improved field-effect transistor of the type having a source region and a drain region, a channel layer extending between the source region and the drain region, the channel layer including a semiconducting material, a gate region, disposed in spaced adjacency to the channel layer, an electrically insulating layer between the gate region and the source region, drain region and channel layer, wherein the method comprises:
preparing a channel layer comprising a film of a metal chalcogenide semiconducting material which comprises preparing a solution of a precursor of a metal chalcogenide by adding an elemental metal and an elemental chalcogen to a hydrazine compound to provide a solution of said precursor of the metal chalcogenide;
applying a solution of said precursor onto a substrate to produce a film of said precursor; and annealing the film of the precursor to produce the metal chalcogenide film on said substrate.

20. The method of claim 19 wherein the annealing is carried out at a temperature of about 50 to about 500°C.

* * * * *